United States Patent
Omori et al.

(10) Patent No.: US 10,361,109 B2
(45) Date of Patent: Jul. 23, 2019

(54) STORAGE FACILITY

(71) Applicant: Daifuku Co., Ltd., Osaka-shi (JP)

(72) Inventors: Kazuya Omori, Hinocho (JP); Shinsuke Kawamura, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 351 days.

(21) Appl. No.: 15/251,484

(22) Filed: Aug. 30, 2016

(65) Prior Publication Data

US 2017/0062243 A1    Mar. 2, 2017

(30) Foreign Application Priority Data

Sep. 2, 2015 (JP) .................................. 2015-173251

(51) Int. Cl.
*H01L 21/673* (2006.01)
*H01L 21/677* (2006.01)

(52) U.S. Cl.
CPC .. *H01L 21/67769* (2013.01); *H01L 21/67389* (2013.01); *H01L 21/67393* (2013.01); *H01L 21/67775* (2013.01)

(58) Field of Classification Search
CPC ......... H01L 21/67769; H01L 21/67775; H01L 21/67389; H01L 21/67393
See application file for complete search history.

(56) References Cited

U.S. PATENT DOCUMENTS

| | | | | |
|---|---|---|---|---|
| 6,123,120 A * | 9/2000 | Yotsumoto | ........ | H01L 21/67769 141/59 |
| 7,955,044 B2 * | 6/2011 | Moriya | .................... | B65G 1/02 414/806 |
| 8,777,553 B2 * | 7/2014 | Hirano | .............. | H01L 21/67017 414/805 |
| 8,926,251 B2 * | 1/2015 | Iizuka | ............... | H01L 21/67389 414/217 |
| 8,942,844 B2 * | 1/2015 | Takahara | ................. | B65G 1/06 700/213 |
| 8,961,095 B2 * | 2/2015 | Takahara | ................ | B60S 11/00 29/402.03 |
| 9,056,718 B2 * | 6/2015 | Ito | ........................ | B65G 1/0407 |
| 9,064,918 B2 * | 6/2015 | Takahara | .......... | H01L 21/67769 |
| 9,064,921 B2 * | 6/2015 | Shin | .................. | H01L 21/67772 |
| 9,187,300 B2 * | 11/2015 | Yoshioka | ................. | B66F 9/07 |
| 9,199,793 B2 * | 12/2015 | Takahara | ................. | B65G 1/16 |
| 9,230,845 B2 * | 1/2016 | Otsuka | .................... | A47F 10/00 |
| 9,245,781 B2 * | 1/2016 | Takahara | .......... | H01L 21/67393 |
| 9,266,629 B2 * | 2/2016 | Takahara | ................. | B65B 5/00 |
| 9,296,560 B2 * | 3/2016 | Fukushima | ....... | H01L 21/67389 |
| 9,359,135 B2 * | 6/2016 | Nagamine | ............... | B65G 1/02 |

(Continued)

FOREIGN PATENT DOCUMENTS

JP             20159912 A     1/2015

*Primary Examiner* — Nicolas A Arnett
(74) *Attorney, Agent, or Firm* — The Webb Law Firm

(57) ABSTRACT

A storage facility includes a storage rack including a plurality of storage sections and a gas supply portion that supplies an inactive gas to containers stored in the storage sections. Struts are installed at left and right ends of the storage rack and between adjacent ones of the storage sections, and placement portions are fixed to mutually adjacent ones of the struts. Each vertical pipe included in the gas supply portion is fixed to one of the struts to which the placement portion to which the inactive gas is supplied by the vertical pipe is fixed.

9 Claims, 8 Drawing Sheets

(56) References Cited

U.S. PATENT DOCUMENTS

| | | | |
|---|---|---|---|
| 9,364,086 B2* | 6/2016 | Takahara | A47B 81/00 |
| 9,457,955 B2* | 10/2016 | Omori | B65G 1/02 |
| 9,520,311 B2* | 12/2016 | Otsuka | H01L 21/67393 |
| 9,524,893 B2* | 12/2016 | Takahara | H01L 21/67769 |
| 9,541,534 B2* | 1/2017 | Otsuka | G01N 33/0009 |
| 9,595,461 B2* | 3/2017 | Takahara | F17C 13/02 |
| 9,679,795 B2* | 6/2017 | Otsuka | H01L 21/67769 |
| 9,687,889 B2* | 6/2017 | Shibata | B05B 15/68 |
| 9,695,509 B2* | 7/2017 | Hirano | H01L 21/67017 |
| 9,818,634 B2* | 11/2017 | Omori | H01L 21/67769 |
| 9,822,929 B2* | 11/2017 | Shin | F17C 5/007 |
| 9,878,353 B2* | 1/2018 | Murata | H01L 21/67769 |
| 9,899,247 B2* | 2/2018 | Kawamura | H01L 21/67379 |
| 9,911,635 B2* | 3/2018 | Hirano | H01L 21/67379 |
| 9,960,065 B2* | 5/2018 | Kawasaki | H01L 21/67253 |
| 9,997,387 B2* | 6/2018 | Murata | H01L 21/673 |
| 10,006,894 B2* | 6/2018 | Abe | G01F 1/28 |
| 10,053,293 B2* | 8/2018 | Yoshimoto | B65G 19/225 |
| 10,081,951 B2* | 9/2018 | Omori | E04F 13/086 |
| 2008/0156069 A1* | 7/2008 | Murata | G01D 21/00 73/19.04 |
| 2009/0272461 A1* | 11/2009 | Alvarez, Jr. | H01L 21/67017 141/64 |
| 2014/0000757 A1* | 1/2014 | Takahara | H01L 21/67769 141/8 |
| 2014/0003893 A1* | 1/2014 | Takahara | B65G 1/06 414/273 |
| 2014/0003894 A1* | 1/2014 | Takahara | B60S 11/00 414/277 |
| 2014/0014225 A1* | 1/2014 | Takahara | H01L 21/67769 141/4 |
| 2014/0014229 A1* | 1/2014 | Takahara | B65B 5/00 141/129 |
| 2014/0017040 A1* | 1/2014 | Takahara | H01L 21/67393 414/222.01 |
| 2014/0112739 A1* | 4/2014 | Hirano | H01L 21/67017 414/217.1 |
| 2014/0124331 A1* | 5/2014 | Fukushima | H01L 21/67389 198/347.2 |
| 2015/0000372 A1* | 1/2015 | Otsuka | G01N 33/0009 73/23.2 |
| 2015/0000591 A1* | 1/2015 | Kawasaki | H01L 21/67253 118/695 |
| 2015/0000759 A1* | 1/2015 | Takahara | F17C 13/02 137/15.04 |
| 2015/0000765 A1* | 1/2015 | Otsuka | H01L 21/67769 137/356 |
| 2015/0000785 A1* | 1/2015 | Shin | F17C 5/007 141/4 |
| 2015/0000789 A1* | 1/2015 | Otsuka | H01L 21/67393 141/369 |
| 2015/0003941 A1* | 1/2015 | Takahara | B65G 1/16 414/269 |
| 2015/0004899 A1* | 1/2015 | Otsuka | F24F 3/161 454/341 |
| 2015/0202664 A1* | 7/2015 | Murata | H01L 21/67769 134/25.5 |
| 2015/0380288 A1* | 12/2015 | Hirano | H01L 21/67379 438/597 |
| 2016/0130084 A1* | 5/2016 | Omori | B65G 1/02 700/218 |
| 2016/0189993 A1* | 6/2016 | Nakagawa | H01L 21/67389 118/697 |
| 2016/0351427 A1* | 12/2016 | Murata | B08B 5/04 |
| 2016/0358799 A1* | 12/2016 | Murata | H01L 21/67389 |
| 2017/0062255 A1* | 3/2017 | Omori | H01L 21/67769 |
| 2017/0138059 A1* | 5/2017 | Omori | E04F 13/086 |
| 2017/0138069 A1* | 5/2017 | Omori | B65G 1/065 |
| 2017/0140949 A1* | 5/2017 | Onishi | H01L 21/673 |
| 2017/0233191 A1* | 8/2017 | Yoshimoto | B65G 19/225 198/793 |
| 2017/0256428 A1* | 9/2017 | Kawamura | H01L 21/67379 |
| 2017/0283170 A1* | 10/2017 | Kawamura | B65G 1/0407 |
| 2018/0072498 A1* | 3/2018 | Abe | H01L 21/00 |
| 2018/0076055 A1* | 3/2018 | Abe | H01L 21/673 |
| 2018/0076073 A1* | 3/2018 | Abe | H01L 21/67389 |
| 2018/0076077 A1* | 3/2018 | Abe | H01L 21/67775 |
| 2018/0076078 A1* | 3/2018 | Tanaka | H01L 21/67769 |
| 2018/0105361 A1* | 4/2018 | Horii | B61B 3/02 |
| 2018/0224311 A1* | 8/2018 | Ueda | G01F 7/005 |

* cited by examiner

US 10,361,109 B2

STORAGE FACILITY

CROSS-REFERENCE TO RELATED APPLICATION

This application claims priority to Japanese Patent Application No. 2015-173251 filed Sep. 2, 2015, the disclosure of which is hereby incorporated in its entirety by reference.

FIELD OF THE INVENTION

The present invention relates to a storage facility that stores various types of articles.

BACKGROUND

A storage facility is used for temporarily storing raw materials or intermediate products, for example, during a waiting time before they are subjected to the next step in the manufacturing process of industrial products, for example. In this case, for example, when the industrial products are semiconductor products and storage articles are containers accommodating semiconductor substrates, in order to avoid surface contamination of the semiconductor substrates during storage, a storage facility configured to purge the stored containers with an inactive gas is used. As an example, the storage facility disclosed in JP 2015-009912A includes a storage rack (storage device 10) including a plurality of storage sections (storage sections 11), and a gas supply portion (inactive gas supply portion 50) that supplies an inactive gas to the stored containers (containers 4).

SUMMARY OF THE INVENTION

In the storage facility of JP 2015-009912A, the plurality of storage sections that are disposed so as to be aligned vertically and horizontally are grouped into a plurality of units, and an inactive gas is supplied to each of the units (see FIG. 5 of JP 2015-009912A). Then, from a vertical pipe (first pipe 51a) extending in the up-down direction, branch pipes (second pipes 51b) extending to the corresponding ones of a plurality of columns of storage sections in each row are branched off, and the inactive gas is supplied to all of the storage sections included in the corresponding unit.

Such a configuration requires a vertical pipe that allows passage of the whole amount of the inactive gas supplied to many storage sections arranged over a plurality of rows and columns, so that the diameter of the vertical pipe is large. Accordingly, in the storage facility of JP 2015-009912A, in order to secure a space for providing a large diameter vertical pipe, a placement portion (placement support portion 15) is not installed in some of the columns, and those columns are not utilized as the storage sections (see Paragraph 0053 and FIGS. 2 and 5 of JP 2015-009912A). As a result, the storage efficiency of the storage rack is reduced by the presence of the columns that are not utilized as the storage sections.

There is a need for an improvement of the storage efficiency in a storage facility configured to purge each of storage containers with an inactive gas.

In view of the foregoing, a storage facility according to an aspect includes:

a storage rack including a plurality of storage sections that are disposed so as to be aligned in a plurality of rows in an up-down direction and a plurality of columns in a left-right direction; and a gas supply portion that supplies an inactive gas to each container stored in the storage sections, wherein the storage rack includes a plurality of struts provided upright along the up-down direction, and placement portions that are supported by the struts and on which the containers are placed, the gas supply portion includes a plurality of vertical pipes extending in the up-down direction, and a plurality of branch pipes that branch off from each of the vertical pipes and are connected to gas inlets provided individually on the placement portions, the struts are installed at positions located at left and right ends of the storage rack and between mutually adjacent ones of the storage sections, each of the placement portions is fixed to mutually adjacent ones of the struts, and each of the plurality of vertical pipes is fixed to one of the struts to which the placement portion to which the inactive gas is supplied by the vertical pipe is fixed.

With this configuration, the struts are installed so as to be distributed at positions located at left and right ends of the storage rack and between mutually adjacent storage sections. Accordingly, each individual placement portion can be fixed to mutually adjacent struts. This allows the plurality of storage sections to be handled independently for each column, without grouping the storage sections into units spanning the plurality of columns. Then, by disposing the plurality of vertical pipes constituting the gas supply portion so as to be distributed according to the arrangement of the plurality of struts, it is possible to reduce the diameter of each individual vertical pipe. Accordingly, the plurality of vertical pipes for supplying the inactive gas to the gas inlets provided individually on the placement portions can be provided in the peripheral region of each of the plurality of struts disposed so as to be distributed, while avoiding the interference with other elements. Thus, it is not necessary to secure the space for providing the vertical pipes by compromising the installation space for the placement portions, so that it is possible to utilize all of the columns as the storage sections. Therefore, it is possible to improve the storage efficiency in a storage facility configured to purge each of the storage containers with the inactive gas.

DETAILED DESCRIPTION

A storage facility according to an embodiment will now be described. The present embodiment describes, as an example, a storage facility 1 that stores containers 7 accommodating semiconductor substrates constituted by semiconductor wafers or the like as storage articles. The storage facility 1 of the present embodiment is installed, for example, in a clean room, and is used, for example, for temporarily storing raw materials or intermediate products, for example, during a waiting time before they are subjected to the next step in the manufacturing process of a semiconductor product. The storage function of the storage facility 1 is mainly realized by storage racks 2 each including a plurality of storage sections S. In the following, the storage facility 1 and the storage racks 2 of the present embodiment will be described in detail.

In the following description, an up-down direction V, a left-right direction H, and a front-rear direction D are each defined with respect to a reference direction facing directly toward a storage rack 2 positioned in the storage facility 1. That is, the up-down direction V coincides with the height direction of the storage rack 2, the left-right direction H coincides with the width direction of the storage rack 2, and the front-rear direction D coincides with the depth direction of the storage rack 2. In the following description, the expression "along a certain direction" represents a concept including not only a state of being parallel to the reference direction, but also a state of being slightly inclined (e.g., at an angle less than 10°) relative to the reference direction. The terms regarding directions and dimensions (e.g., "parallel" and "equidistantly") used in the following description represent concepts including a state with a difference due to an error (allowable error for manufacture and installation).

Figure 1:
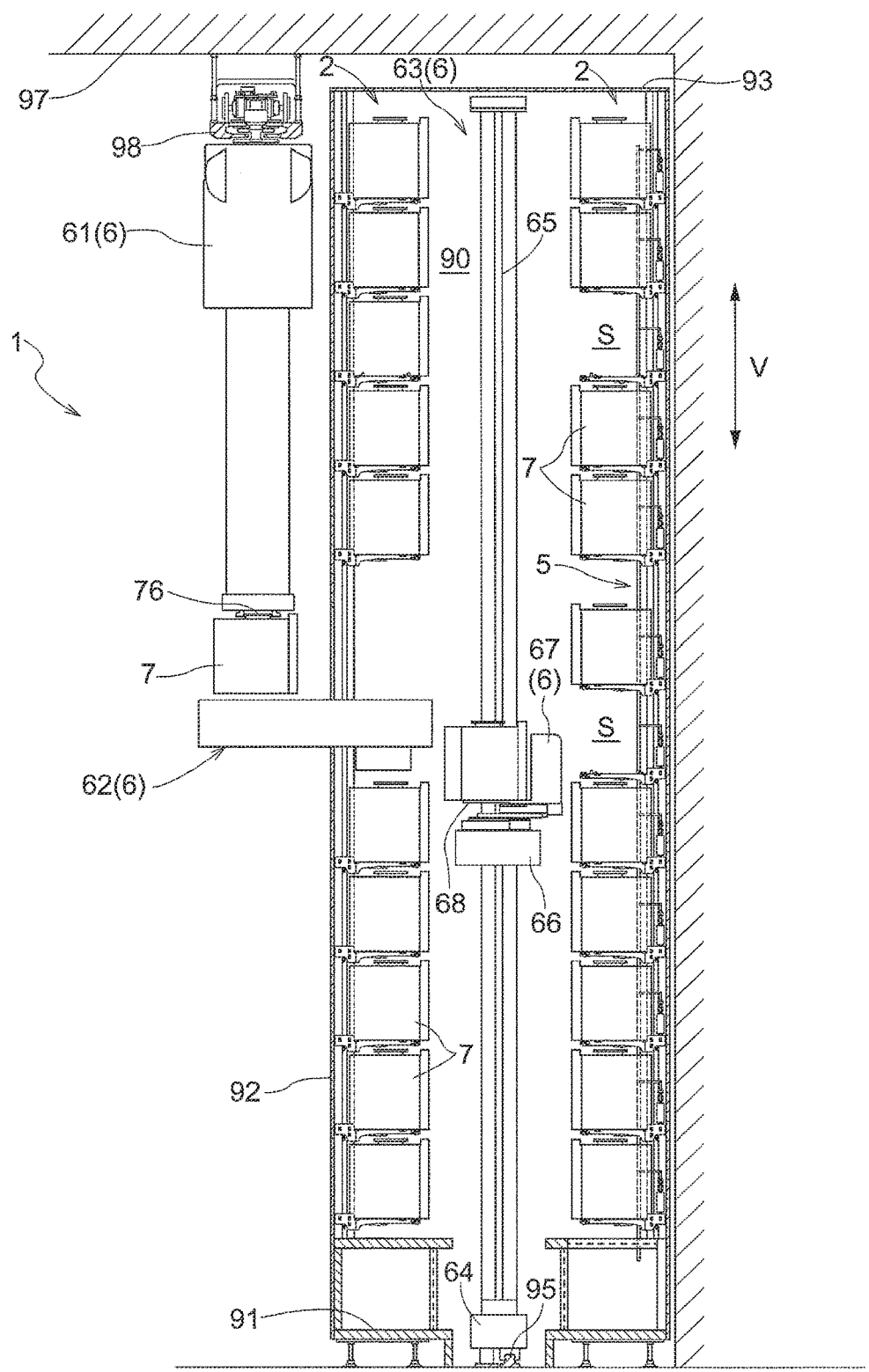
FIG. 1 is a side view of a storage facility according to an embodiment.

As shown in FIG. 1, the storage facility 1 includes storage racks 2 each including a plurality of storage sections S. The storage facility 1 further includes a gas supply portion 5 that supplies an inactive gas to each of container 7 stored in the storage section S. The storage racks 2 and the gas supply portion 5 are provided in a storage room 90 whose periphery is covered by a floor portion 91, a peripheral wall portion 92 and a ceiling portion 93. The storage facility 1 further includes a transport portion 6 that transports the containers 7 to and from the storage sections S. The transport portion 6 includes a first transport device 61, a moving device 62, a second transport device 63, and a transfer device 67 as its main constituent elements. The first transport device 61 is provided outside the storage room 90. The moving device 62 is provided so as to penetrate through the peripheral wall portion 92. The second transport device 63 and the transfer device 67 are provided inside the storage room 90. The operation of each of the gas supply portion 5 and the transport portion 6 is controlled in accordance with an instruction from a control device (not shown) included in the storage facility 1.

In the present embodiment, the storage facility 1 includes a pair of two storage racks 2. The two storage racks 2 are installed so as to oppose each other across the second transport device 63. In the present embodiment, one of the two storage racks 2 is a "purge rack (target storage rack)" in which the gas supply portion 5 is installed, and the other one is a "non-purge rack" in which no gas supply portion 5 is installed. The purge rack and the non-purge rack basically have the same structure except for the presence or absence of the gas supply portion 5 and the presence or absence of an installation space for the moving device 62 constituting the transport portion 6.

Figure 2:
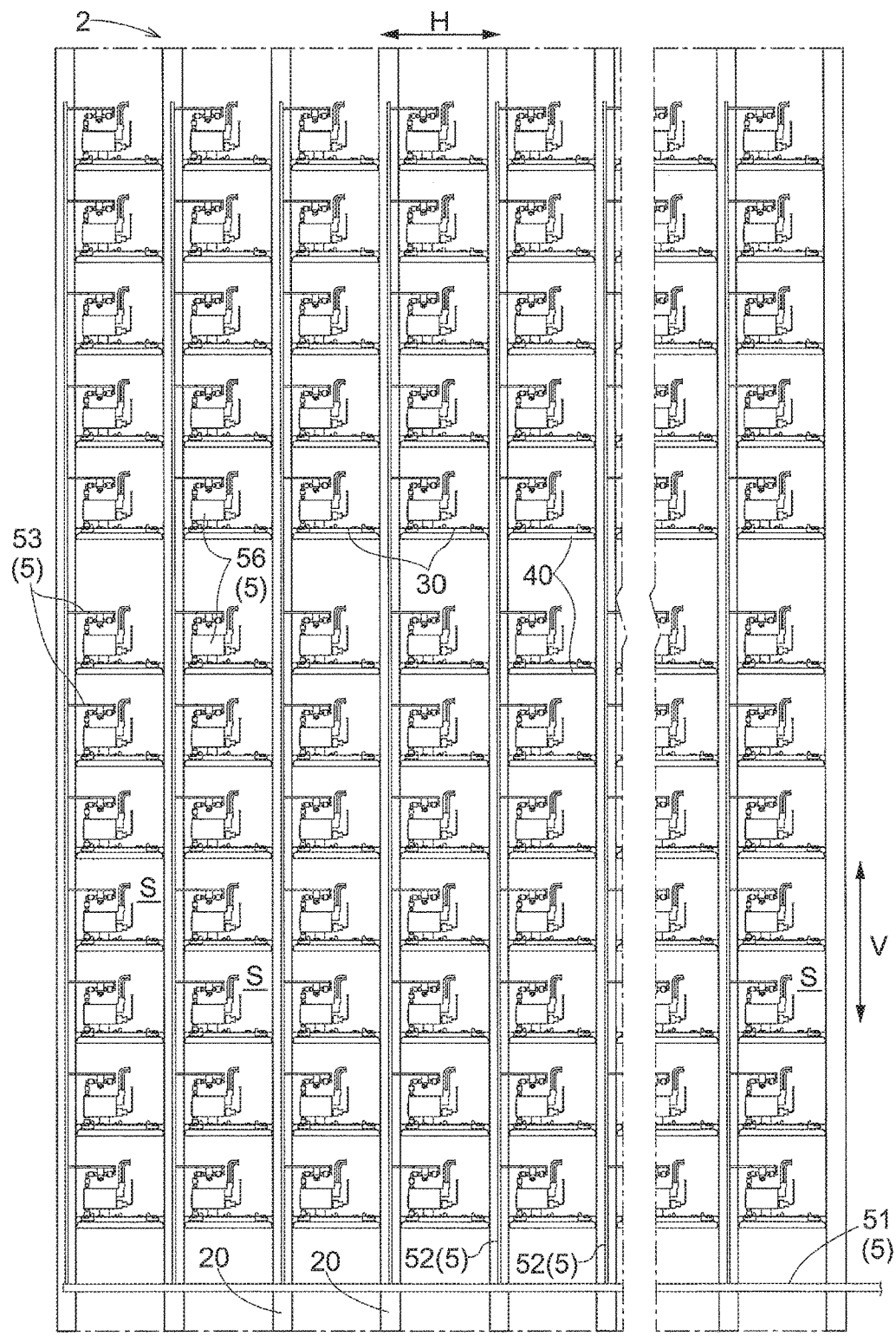
FIG. 2 is a front view of a storage rack.
Figure 3:
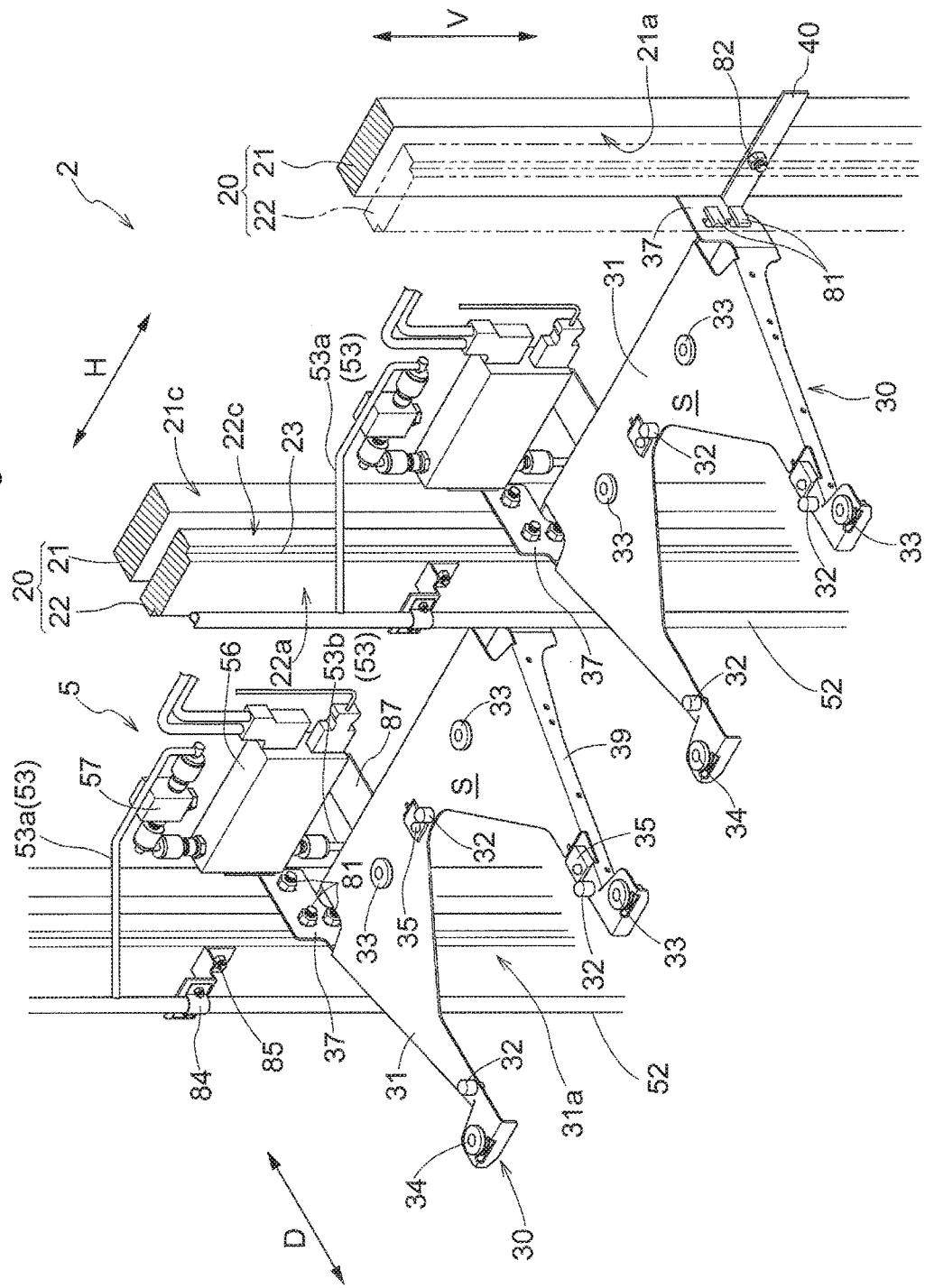
FIG. 3 is a perspective view of storage sections.

As shown in FIG. 2, each storage rack 2 includes a plurality of storage sections S that are disposed so as to be aligned vertically and horizontally. The storage rack 2 includes a plurality of (in the present example, 156) storage sections S that are disposed so as to be aligned in m rows (m is any integer of 2 or more, and in the present example, m=12) in the up-down direction V, and n columns (n is any integer of 2 or more, and in the present example, n=13) in the left-right direction H. In the present embodiment, all of the storage sections S belonging to each row are disposed at the same positions in the up-down direction V, and all of the storage sections S belonging to each column are disposed at the same positions in the left-right direction H, so that the plurality of storage sections S as a whole are disposed so as to be aligned in an orthogonal grid configuration.

The storage rack 2 includes a plurality of struts 20 provided upright in the up-down direction V, and placement portions 30 that are supported by the struts 20 and on each of which a container 7 is placed. In the present embodiment, the number of struts 20 included in the storage rack 2 is greater than the number of columns of the storage section S by one (i.e., n+1). The (n+1) struts 20 are installed so as to be equidistantly arranged in a line in the left-right direction H. Then, each placement portion 30 is fixed to mutually adjacent struts 20. In the present embodiment, at an n number of locations that is equal to the number of columns of the storage sections S, m placement portions 30 equal to the number of rows of the storage section S are fixed to mutually adjacent struts 20. Each storage section S is formed by a space constituting an upper space of the corresponding placement portion 30, the space being defined below the placement portion 30 in the next higher row. In this manner, in the present embodiment, the (n+1) struts 20 are installed at positions located at both ends of the storage rack 2 in the left-right direction H and between storage sections S mutually adjacent in the left-right direction H.

Figure 5:
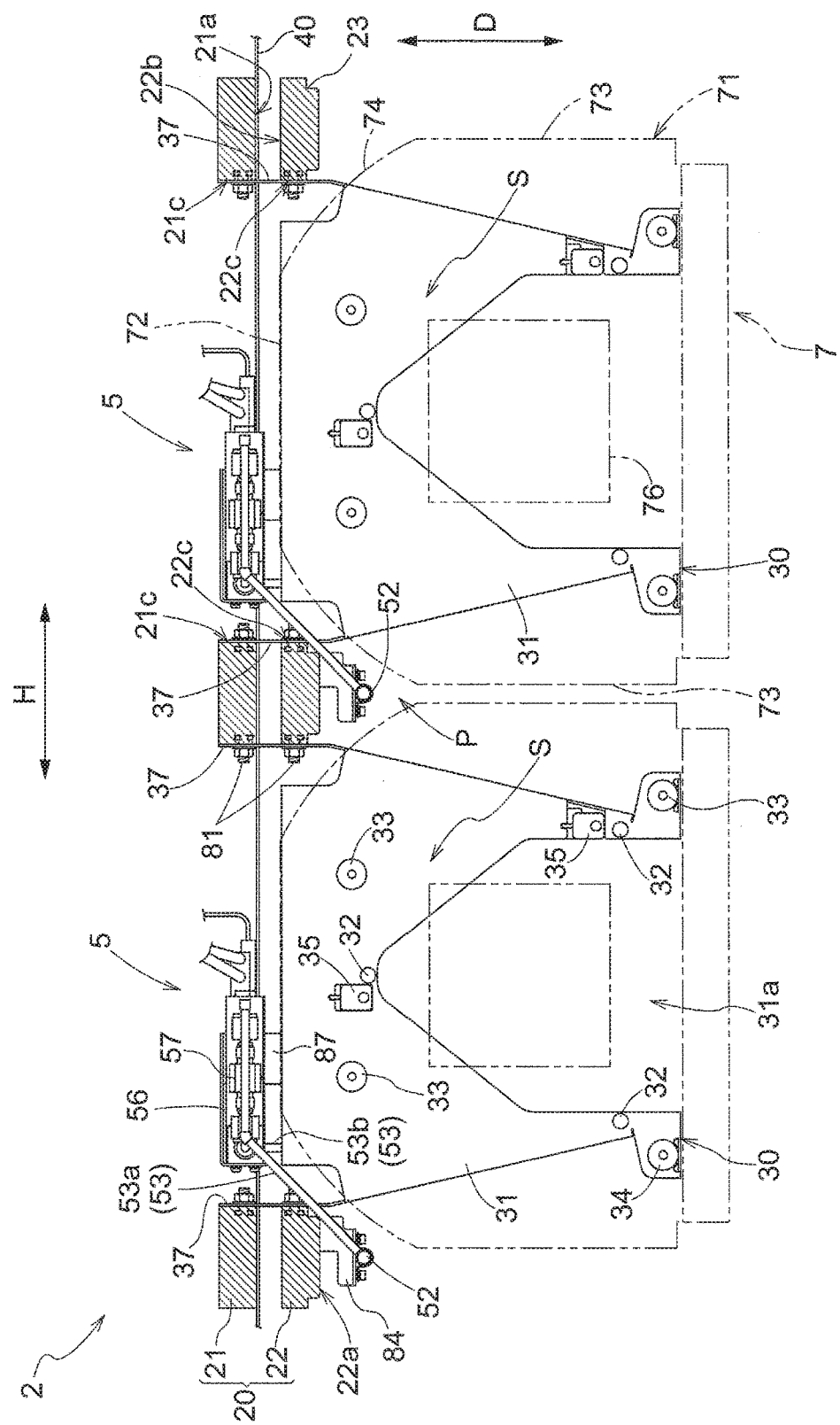
FIG. 5 is a plan view of storage sections.
Figure 6:
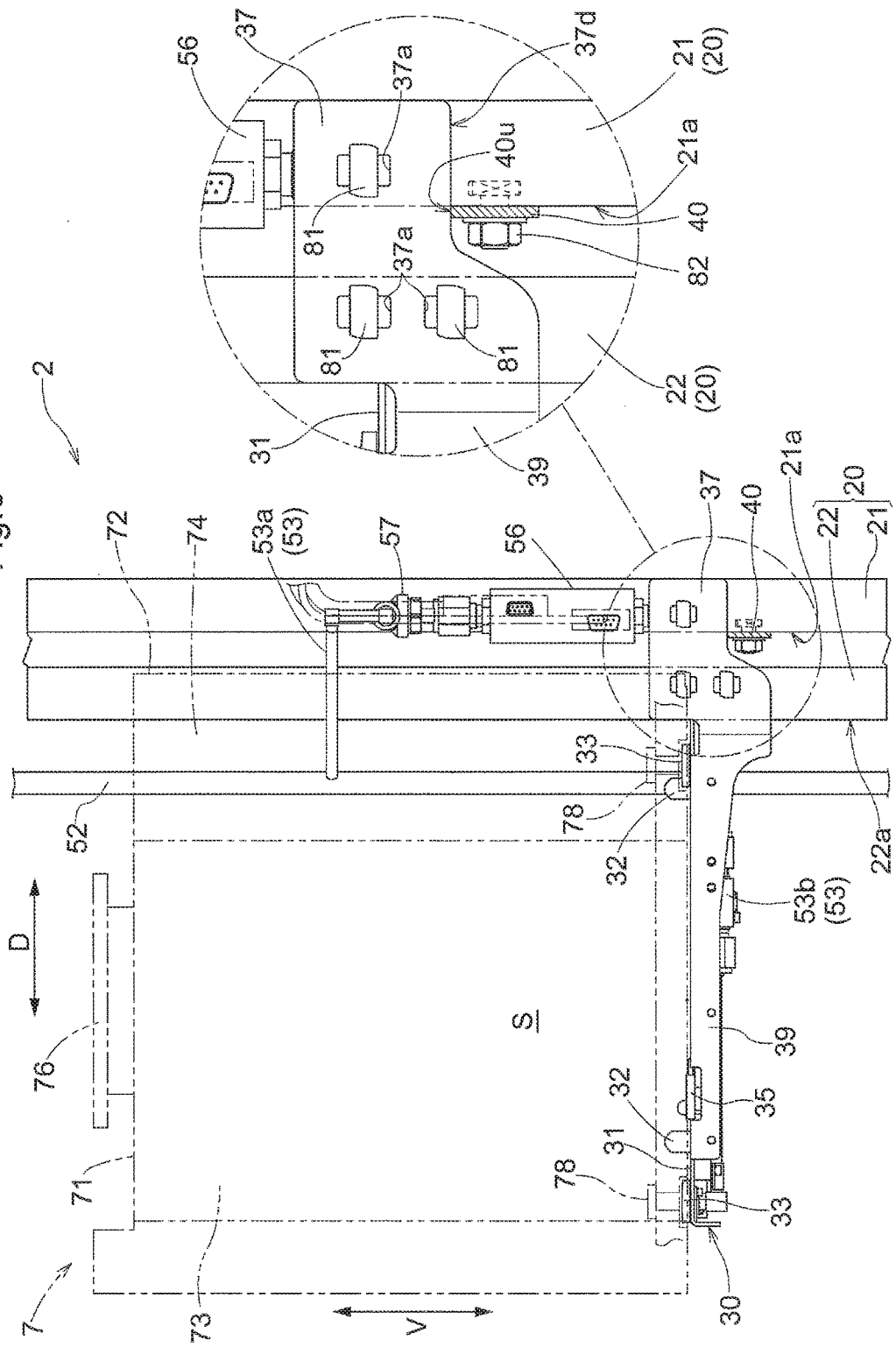
FIG. 6 is a side view of storage sections.

As the container 7, a front opening, box-shaped containers called FOUP (Front Opening Unified Pod) may be used, for example. Such containers 7 may be used as airtight synthetic resin containers compliant with the SEMI (Semiconductor Equipment and Materials International) standard. As shown in FIGS. 5 and 6, each container 7 includes a casing 71 having an opening, and a lid member (not shown) configured to be removable from the casing 71 and to cover the opening. The container 7 is configured such that its internal space is air-tightly sealed in a state in which the lid member is attached to the casing 71. The container 7 further includes, on its upper surface, a flange 76 that is held by the first transport device 61.

The casing 71 constituting the container 7 is formed in a rectangular solid-like shape as a whole. The "rectangular solid-like shape" means a shape whose general shape as a whole is a rectangular solid even though it has some differently shaped portions (the same applies to other terms regarding shapes and the like that are used with "-like" in the following description). The container 7 includes a back plate portion 72, a pair of side plate portions 73, and planar or curved oblique plate portions 74 provided in regions between the back plate portion 72 and each of the side plate portions 73. In this manner, the container 7 of the present embodiment is formed in a chamfered rectangular solid-like shape including the oblique plate portions 74 on the left and right sides at the back. Also taking such a three-dimensional shape of the container 7 into consideration, a strut 20 installed between mutually adjacent storage sections S is disposed in a space defined by the opposing oblique plate portions 74 of two containers 7 that are mutually adjacent in the left-right direction H in a state in which the containers are placed on the placement portions 30 (see FIG. 5). This enables the plurality of struts 20 constituting the storage rack 2 to be disposed so as to be appropriately distributed in the left-right direction H, while avoiding interference with the containers 7 as the storage articles.

As shown in FIGS. 3 to 6, each placement portion 30 is fixed to the struts 20 in a cantilevered manner, on the back side (far side) in the front-rear direction D. The placement portion 30 is open on its front side (near side) in the front-rear direction D, and thus is not supported by any member. Such a cantilevered structure is advantageous in that the container 7 can be easily transferred to and from the storage section S from the front side.

The placement portion 30 includes a placement body portion 31 that receives and supports the placed container 7 from below, and a pair of mounting plate portions 37 each of which is fixed to a strut 20. The placement body portion 31 is formed in a flat plate-like shape extending along the left-right direction H and the front-rear direction D. The placement body portion 31 includes, on its front side, a cut-out portion 31a having a pentagonal shape in plan view, and is formed to have a U-shape in plan view. The cut-out portion 31a of the placement body portion 31 serves as a space through which a support member 68 included in the transfer device 67 passes vertically.

On the upper surface of the placement body portion 31, a plurality of (in the present example, three) protruding pins 32 are provided so as to protrude upward. The plurality of protruding pins 32 are provided along the cut-out portion 31a. Engaging recesses (not shown) formed by groove portions, hole portions or the like are formed on the bottom surface of the container 7. In a state in which the protruding pins 32 are engaged with the engaging recesses of the container 7, the container 7 is positioned relative to the placement body portion 31. In the present embodiment, one protruding pin 32 is provided in the vicinity of the vertex of the pentagonal cut-out portion 31a, and two protruding pins 32 are provided in the vicinity of the protruding distal ends (U-shape distal end portions) of the U-shaped placement body portion 31. The interval between the two protruding pins 32 provided at the U-shape distal end portions in the left-right direction H is narrower than the interval between the pair of struts 20 mutually adjacent in the left-right direction H.

On the upper surface of the placement body portion 31, gas inlets 33 for supplying the inactive gas supplied from the gas supply portion 5 into the container 7, and a gas outlet 34 for allowing the gas discharged from the inside of the container 7 to pass therethrough are provided. A below-described branch pipe 53 constituting the gas supply portion 5 is connected to the gas inlets 33. An exhaust pipe (not shown) whose end opposite to the gas outlet 34 is open is connected to the gas outlet 34. A supply port 78 (see FIG. 6) for injecting the inactive gas supplied from the gas supply portion 5 into the container 7 and an exhaust port (not shown) for discharging the gas existing inside the container 7 are formed on the bottom surface of the container 7. In a state in which the container 7 is positioned on the placement body portion 31, the gas inlets 33 and the supply port 78 are in communication with each other, and the gas outlet 34 and the exhaust port are in communication with each other. When the inactive gas at a predetermined pressure is supplied from the gas supply portion 5, the inactive gas is injected from the supply port 78 into the container 7, while the gas inside the container 7 is being discharged from the exhaust port to the outside.

A plurality of (in the present example, two) load presence sensors 35 are also provided on the upper surface of the placement body portion 31. The load presence sensors 35 may be each constituted by a pressure-sensitive sensor, for example. The load presence sensors 35 detect whether the container 7 is placed on the placement portion 30 (i.e., whether the container 7 is stored in the storage section S).

The pair of mounting plate portions 37 are formed in a plate shape extending along the up-down direction V and the front-rear direction D. The mounting plate portions 37 are disposed on both ends of the placement portion 30 in the left-right direction H so as to oppose each other in the left-right direction H, and to face the respective side surfaces of the corresponding struts 20. The mounting plate portions 37 are disposed so as to intersect with (in the present example, to be orthogonal to) the placement body portion 31. The mounting plate portions 37 are formed to have an L-shape in side view. The mounting plate portions 37 are disposed on the back side of the placement body portion 31 such that a portion thereof is located further backward relative to the placement body portion 31. Each of the mounting plate portions 37 has a plurality of (in the present example, three) insertion holes 37a penetrating therethrough in its thickness direction (in the present example, the left-right direction H) (see FIG. 6). The insertion holes 37a are hole portions for inserting shaft portions of bolts constituting fastening members 81 for fixing the placement portion 30 to the struts 20.

The placement portion 30 further includes a pair of rib portions 39 provided so as to intersect with (in the present example, to be orthogonal to) the placement body portion 31. The pair of rib portions 39 are formed generally in an elongated flat plate-like shape extending along the up-down direction V and the front-rear direction D. The rib portions 39 linearly extend so as to connect, in plan view, the protruding pins 32 provided on the U-shape distal end portions serving as the load bearing points of the placement body portion 31 to the struts 20. The rib portions 39 are inclined slightly (in the present example, at approximately 15°) relative to the front-rear direction D such that the rib portions 39 extend toward the inner side in the left-right direction H (toward the center of the storage section S in the left-right direction) as they extend from the back side, on which the struts 20 are installed, toward the front side, on which the U-shape distal end portions are located.

In the present embodiment, the placement body portion 31 and the rib portions 39 that constitute the placement portion 30 may be integrally formed. Alternatively, the mounting plate portions 37 may also be included, i.e., the placement body portion 31, the rib portions 39, and the mounting plate portion 37 that constitute the placement portion 30 may be integrally formed. In the present embodiment, the placement body portion 31, the rib portions 39, and the mounting plate portions 37 are integrally formed by bending a metal flat plate member. In the illustrated example, a case is shown where a non-porous plate is used as the metal flat plate member. However, the present invention is not limited to such a configuration, and it is also possible to use a porous plate such as a mesh plate or a punched plate.

In the present embodiment, the placement portion 30 is provided with the rib portions 39 integrated with the placement body portion 31, so that it is possible to increase the strength of the placement portion 30 itself. Since the rib portions 39 linearly extend so as to connect the struts 20 to the U-shape distal end portions serving as the load bearing points of the placement body portion 31, it is possible to ensure a sufficient supporting strength of the placement portion 30 to the container 7. In particular, it is possible to ensure a sufficient supporting strength of the placement portion 30 to the container 7, without additionally providing a reinforcing member at the connecting portion between the struts 20 and the placement portion 30. Furthermore, a placement portion 30 having a sufficient supporting strength while being light-weight can be easily formed by bending a metal flat plate member.

Here, in the present embodiment, the plurality of struts 20 provided upright along the up-down direction V each include a pair of divided strut members 21 and 22 that are divided in the front-rear direction D (see FIG. 5). The strut 20 (divided strut members 21 and 22) having such a divided structure is advantageous in that it is possible to reduce the material cost while ensuring at least the same level of strength as the strength provided by a strut 20 configured as a unitary structure. Each of the plurality of struts 20 includes a first divided strut member 21 and a second divided strut member 22 disposed parallel to the first divided strut member 21 with a gap in the front-rear direction D in between. The first divided strut member 21 and the second divided strut member 22 are connected and fixed to each other via spacers (not shown) provided therebetween in the front-rear direction D at a plurality of locations in the up-down direction V. Note that the gap in the front-rear direction D between the first divided strut member 21 and the second divided strut member 22 is sufficiently smaller than (e.g., less than 1/15 of) the length in the front-rear direction D of the placement portion 30. The pair of divided strut members 21 and 22 are both connected to a back end of the placement portion 30. The second divided strut member 22 is disposed on the front side relative to the first divided strut member 21. The second divided strut member 22 is disposed so as to overlap, in side view, the back end of the container 7 in a state in which the container 7 is placed on the placement portion 30 (see FIG. 6). On the other hand, the first divided strut member 21 is disposed on the back side relative to the container 7 placed on the placement portion 30, without overlapping the container 7.

The storage rack 2 further includes a crossbar member 40 extending in the left-right direction H. The crossbar member 40 extends across the struts 20 mutually adjacent in the left-right direction H. Due to the divided structure of the struts 20, the crossbar member 40 is provided between the pair of divided strut members 21 and 22 in the front-rear direction D in the present embodiment. In other words, the crossbar member 40 is disposed using the gap between the first divided strut member 21 and the second divided strut member 22 in the front-rear direction D. More specifically, in the present embodiment, the crossbar member 40 is fixed to a front surface 21*a* of the first divided strut member 21 that is located on the back side, of the pair of divided strut members 21 and 22, and is located on the back side relative to the container 7 placed on the placement portion 30. With such a fixing position, even when a crossbar member 40 is additionally provided, the crossbar member 40 will not interfere with the container 7 placed on the placement portion 30, regardless of the size (especially, the size in the up-down direction V) of the crossbar member 40. Furthermore, the bolt head of a fastening member 82 for fastening and fixing the crossbar member 40 to the first divided strut member 21 can be fitted within the gap between the pair of divided strut members 21 and 22 in the front-rear direction D. In this manner, it is possible to provide the crossbar member 40, without reducing the storage efficiency of the storage rack 2 in the front-rear direction D.

In the present embodiment, the crossbar member 40 is fixed so as to extend across three or more first divided strut members 21 mutually adjacent in the left-right direction H. Preferably, the crossbar member 40 is fixed so as to extend across several first divided strut members 21 mutually adjacent in the left-right direction H. For example, a crossbar member 40 having a length that is half the length of the storage rack 2 in the left-right direction H may be used, and the crossbar member 40 may be fixed so as to extend across half (in the present example, seven) the number of the first divided strut members 21 mutually adjacent in the left-right direction H. In this manner, since a common crossbar member 40 extends across the plurality of columns of storage sections S, it is possible to easily perform the operation of installing the crossbar member 40. The horizontal installation of the crossbar member 40 can also be easily performed.

With the use of such a crossbar member 40, the placement portion 30 is fixed in a cantilevered manner to the pair of divided strut members 21 and 22 constituting the strut 20. The placement portion 30 is fixed to the pair of divided strut members 21 and 22 such that at least a portion of the placement portion 30 is in contact with an upper end 40*u* of the crossbar member 40. The crossbar member 40 functions as a positioning member that defines at least the installation position and the installation orientation of the placement portion 30 by the upper end 40*u* thereof coming into contact with the placement portion 30. Thus, even when each individual placement portion 30 is fixed to the mutually adjacent struts 20, it is possible to accurately perform the positioning of the placement portion 30 in the up-down direction V. As a result, each individual placement portion 30 can be horizontally (horizontally in plan view) installed, and the height of the placement portion 30 disposed in each row can be made uniform. Furthermore, such accurate positioning of the placement portions 30 can be performed simply by relative movement of the placement portion 30 so as to come into contact with the upper end 40*u* of the crossbar member 40 and fixing the placement portion 30 to the strut 20. Accordingly, the installation operation can be performed very easily.

Furthermore, in the present embodiment, the placement portion 30 is fixed to the pair of divided strut members 21 and 22 in a state in which the pair of mounting plate portions 37 and the crossbar member 40 intersect with each other, and a lower end 37*d* of each of the mounting plate portions 37 is in contact with the upper end 40*u* of the crossbar member 40 (see FIG. 6). This configuration allows the lower ends 37*d* of the pair of mounting plate portions 37 to be stably in contact with the upper end 40*u* of the crossbar member 40 in the intersecting state, so that the positioning of the placement portion 30 in the up-down direction V can be performed even more easily and accurately. The placement portion 30 is fixed to the pair of divided strut members 21 and 22 by means of the fastening members 81 inserted through the insertion holes 37*a* of each mounting plate portion 37 in a state in which the mounting plate portion 37 and side surfaces 21*c* and 22*c* of the pair of divided strut members 21 and 22 are in surface contact with each other (see FIG. 5). In the present example, the placement portion 30 is fixed to the second divided strut member 22 at two upper and lower positions, and is fixed to the first divided strut member 21 at one position that is at the same position in the up-down direction V as the upper fixing position to the second divided strut member 22. The fastening members 81 include, for example, bolts and nuts configured to threadably engage with each other.

When the placement portion 30 is fixed to the struts 20 by using the fastening members 81 including bolts and nuts in a state in which the mounting plate portion 37 and the side surfaces 21*c* and 22*c* are in surface contact with each other, the placement portion 30 may rotate with the fastening members 81 during fastening of the fastening members 81. In this case as well, the rotation of the placement portion 30 following the fastening can be restricted by the contact between the upper end 40*u* of the crossbar member 40 and the lower end 37*d* of the mounting plate portion 37. The crossbar member 40 also functions as a rotation restriction member during fastening and fixation using the fastening members 81 by the upper end 40*u* thereof coming into contact with the placement portion 30 (the lower end 37*d* of the mounting plate portion 37). Accordingly, each individual placement portion 30 can be horizontally (horizontally in side view as well) installed.

In the present embodiment, the placement portion 30 is fixed to the first divided strut member 21 and the second divided strut member 22 across the pair of divided strut members 21 and 22, or in other words, on both sides across the crossbar member 40 in the front-rear direction D. With such a configuration, in a state in which the container 7 is placed on the placement portion 30, a portion of the downward load acting on the placement portion 30 with the fixed position on the first divided strut member 21 side as a fulcrum is also supported by the crossbar member 40 from below. The crossbar member 40 also functions as a support aid member during storage of the container 7 by the upper end 40*u* thereof coming into contact with the placement portion 30 (the lower end 37*d* of the mounting plate portion 37). Thus, by a synergistic effect produced by providing the above-described rib portions 39 on the placement portion 30, the supporting strength of the placement portion 30 to the container 7 can be further increased.

Of the pair of storage racks 2, only the purge rack is provided with the gas supply portion 5. The gas supply portion 5 supplies an inactive gas to each of the containers 7 stored in the storage sections S of the storage rack 2 (in the present example, the purge rack). The inactive gas is a gas that has low reactivity with an article (in the present example, a semiconductor substrate) accommodated in the container 7 (a gas that produces substantially no problematic chemical reaction). Examples of the inactive gas include noble gases such as a nitrogen gas, an argon gas, and a krypton gas.

As shown in FIG. 2, the gas supply portion 5 includes a main pipe 51 connected to an inactive gas supply source (not shown) such as a gas cylinder, a plurality of vertical pipes 52 branching off from the main pipe 51, and a plurality of branch pipes 53 branching off from each of the vertical pipes 52. The inactive gas flows from the inactive gas supply source, and passes through the main pipe 51, the vertical pipes 52, and the branch pipes 53 in this order, and is supplied to the containers 7 of the storage sections S. The main pipe 51 is provided along the left-right direction H, below the storage sections S in the lowest row, for example. The main pipe 51 is formed to have a diameter that enables an inactive gas at a predetermined pressure to be supplied to the containers 7 in a state in which the containers 7 are stored in all of the storage sections S. A manual open/close valve that is openable and closable by a manual operation performed by the operator, and an automatic control valve that is openable and closable in accordance with an instruction from a control device (both not shown) are provided in an upstream side area of the main pipe 51.

Each of the plurality of vertical pipes 52 is provided along the up-down direction V. Each of the plurality of vertical pipes 52 is provided so as to extend upward from the main pipe 51. Each of the plurality of vertical pipes 52 is provided so as to extend over the entire region of the storage rack 2 in the up-down direction V. In the present embodiment, n vertical pipes 52 equal to the number of columns of the storage sections S are installed so as to be equidistantly arranged in a line in the left-right direction H. Here, as described above, the (n+1) struts 20 constituting the storage rack 2 are also installed so as to be equidistantly arranged in a line in the left-right direction H. In the present embodiment, the pitch at which the vertical pipes 52 are provided in the left-right direction H is set to be equal to the pitch at which the struts 20 are provided in the left-right direction H.

Furthermore, each of the plurality of vertical pipes 52 is fixed to the strut 20 to which the placement portions 30 to which the inactive gas is supplied from the vertical pipe 52 are fixed, and is disposed in one-to-one correspondence with one of the plurality of struts 20. In other words, a vertical pipe 52 is individually disposed to each of the plurality of struts 20 (excluding one of the two struts 20 at the left and right ends). To put it differently, one vertical pipe 52 is disposed for each column of storage sections S. Each of the plurality of vertical pipes 52 is individually fixed to the corresponding strut 20. As shown in FIGS. 3 to 6, the vertical pipe 52 is fixed to the corresponding strut 20 by using a fastening member 85 including bolts and nuts in a state in which the vertical pipe 52 is held by a first bracket 84. In the present embodiment, the vertical pipe 52 is fixed via the first bracket 84 to a front surface 22*a* of the second divided strut member 22 located on the front side, of the pair of divided strut members 21 and 22 constituting the strut 20.

Figure 4:
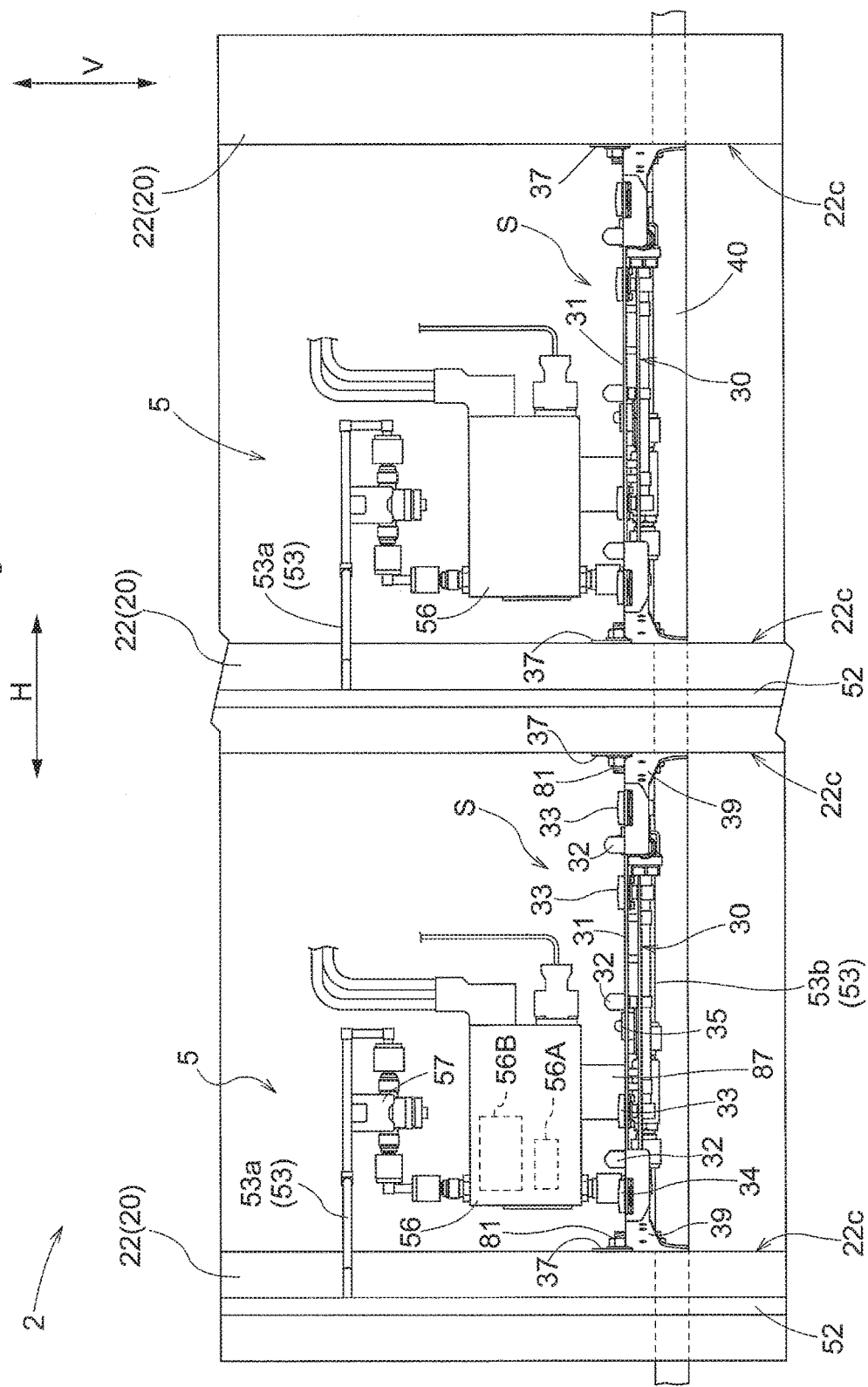
FIG. 4 is a front view of storage sections.

In this manner, each of the plurality of vertical pipes 52 is disposed on the front side relative to the strut 20 (second divided strut member 22) so as to overlap the corresponding strut 20 (second divided strut member 22) in plan view (see FIG. 4). With such a configuration, when the operation of newly installing a gas supply portion 5 in the storage rack 2 in which the gas supply portion 5 has not been installed, the operator can easily arrange and fix a vertical pipe 52 on the front surface 22*a* of the second divided strut member 22 while facing the storage rack 2. Any other element (in particular, the placement portion 30) constituting the storage rack 2 is not present on the front surface 22*a* of the second divided strut member 22, and thus this also facilitates the operation of installing the vertical pipe 52.

The vertical pipe 52 is disposed in a pillar-shaped space P (see FIG. 5). The pillar-shaped space P is a space that extends in the up-down direction and is defined by the opposing oblique plate portions 74 of the containers 7 that are mutually adjacent in a state in which the containers 7 are placed on the placement portions 30, and the strut 20 to which the placement portions 30 on which the mutually adjacent containers 7 are respectively placed are fixed in common. As a result of each of the vertical pipes 52 being disposed using such a pillar-shaped space P, the vertical pipe 52 can be appropriately fixed to the corresponding strut 20 (second divided strut member 22), while avoiding interference with the containers 7 stored in the storage section S.

In this manner, the plurality of vertical pipes 52 constituting the gas supply portion 5 are disposed so as to be distributed according to the arrangement of the plurality of struts 20 in the present embodiment, thereby reducing the diameter of the individual vertical pipes 52. For example, the vertical pipes 52 are formed to have a diameter small enough to supply an inactive gas at a predetermined pressure to the containers 7 in a state in which the containers 7 are stored in all (m storage sections S equal to the number of rows) storage sections S in the corresponding column. Accordingly, even when the containers 7 are stored in the storage sections S, the vertical pipes 52 are fitted in the pillar-shaped spaces P described above, and will not interfere with the stored containers 7. Thus, unlike the storage rack with the conventional specifications, it is not necessary to secure the space for providing the vertical pipes 52 by compromising the installation space for the placement portions 30, so that all columns can be utilized as the storage sections S. Therefore, it is possible to improve the storage efficiency of the storage rack 2.

Note that at least one of a manual open/close valve that is openable and closable by a manual operation performed by the operator and an automatic control valve that is openable and closable in accordance with an instruction from a control device may be provided in a most upstream area of each of the vertical pipes 52.

Each of the plurality of branch pipes 53 branches off from the corresponding vertical pipe 52, and is connected to the gas inlets 33 provided individually on each of the placement portions 30. In the present embodiment, m branch pipes 53 equal to the number of rows of the storage sections S are connected to each of the vertical pipes 52. Each of the m branch pipes 53 is disposed in one-to-one correspondence with the placement portions 30 constituting the storage sections S of each row. In the present embodiment, all of the branch pipes 53 are disposed so as to extend in the same direction from the corresponding vertical pipe 52.

As shown in FIGS. 3 to 6, a flow rate adjustment portion 56 is provided on each of the branch pipes 53. The flow rate adjustment portion 56 includes a flow rate sensor 56A for measuring the flow rate of the inactive gas flowing through its internal flow path, a flow rate adjustment valve 56B that changes and adjusts the flow rate of the inactive gas, and an internal control portion (not shown) that controls the operation of the flow rate adjustment valve 56B. The internal control portion controls the operation of the flow rate adjustment valve 56B based on information indicating the result of detection by the flow rate sensor 56A so as to adjust the flow rate (i.e., the supply flow rate to the container 7) per unit time of the inactive gas to the target flow rate. Accordingly, the flow rate adjustment portion 56 is responsible for adjusting the supply flow rate of the inactive gas to the container 7.

For example, the flow rate adjustment portion 56 adjusts the supply flow rate of the inactive gas such that the supply flow rate is set to a first target flow rate until an initially set supply period has elapsed since the completion of storage of the containers 7 in the storage sections S and then set to a second target flow rate that is set to be a value smaller than the first target flow rate after the initially set supply period has elapsed. Of course, the flow rate adjustment portion 56 may adjust the supply flow rate of the inactive gas by using a supply pattern other than this. Since such a flow rate adjustment portion 56 is provided individually to each of the plurality of storage sections S, the inactive gas can be supplied to each individual container 7 stored in the storage section S in the desired supply pattern. Thus, even when the containers 7 are stored in the storage rack 2 at different times, it is easy to properly maintain the state of the articles contained in the containers 7.

In the present embodiment, a flow rate adjustment portion having a gas leakage amount of less than 0.01% in a non-energized state is used as the flow rate adjustment portion 56. With the use of such a highly airtight flow rate adjustment portion 56, there will be substantially no leakage of the inactive gas from the flow rate adjustment portion 56 even if a system including the storage facility 1 is emergently stopped due to an unexpected error or the like. Accordingly, there is no need to provide the flow rate adjustment portion 56 with a backup, normally-closed open/close valve to prepare for such an unexpected situation. Indeed, the flow rate adjustment portion 56 of the present embodiment is not provided with such a preliminary open/close valve. That is, in the present embodiment, a flow rate adjustment portion having a gas leakage amount of less than 0.01% in a non-energized state is used as the flow rate adjustment portion 56, without providing a backup, normally-closed open/close valve. Thus, it is possible to simplify the layout in the vicinity of the flow rate adjustment portion 56.

The storage facility with the conventional specifications (e.g., see FIG. 4 of JP 2015-012039A) uses an air valve that is less likely to cause a temperature change as a backup open/close valve in order to minimize the influence on the supply flow rate of the inactive gas. However, many of the air valves used for such a purpose are large, posing problems such as a complicated layout in the vicinity of the flow rate adjustment portion 56. The valveless structure of the present embodiment is more advantageous than the conventional specifications that use an air valve in that the layout in the vicinity of the flow rate adjustment portion 56 can be significantly simplified.

As used herein, "backup, normally-closed open/close valve" does not include a manual open/close valve 57 that is openable and closable by a manual operation performed by the operator. The manual open/close valve 57 is configured to be switched between a valve-closed state in which the inactive gas can flow and a valve-open state in which the inactive gas cannot flow by a manual operation performed by the operator. The manual open/close valve 57 has also been mounted to the storage facility with the conventional specifications in addition to the air valve, and is sufficiently smaller than the air valve. Accordingly, the provision of the flow rate adjustment portion 56 with the manual open/close valve 57 has no particular disadvantage. Therefore, indeed, the branch pipe 53 of the present embodiment is provided with the manual open/close valve 57 together with the flow rate adjustment portion 56

The flow rate adjustment portion 56 and the manual open/close valve 57 are provided such that the manual open/close valve 57 is located upstream of the flow rate adjustment portion 56. Then, an upstream pipe portion 53a of the branch pipe 53 is connected to the manual open/close valve 57. The manual open/close valve 57 is connected to an inlet-side port of the flow rate adjustment portion 56. A downstream pipe portion 53b of the branch pipe 53 is connected to a discharge-side port of the flow rate adjustment portion 56. The downstream pipe portion 53b is connected to the gas inlets 33. When a plurality of (in the present example, three) gas inlets 33 are provided as in the present embodiment, the downstream pipe portion 53b is branched off into a number of parts according to the number of the gas inlets 33, and the branched parts are connected to the respective gas inlets 33.

In the present embodiment, the placement body portion 31 is disposed so as to extend over the entire region between the pair of struts 20 on the left and right sides. That is, the region in the left-right direction H in which the placement body portion 31 is disposed in the present embodiment is the entire region between the pair of struts 20 on the left and right sides. The flow rate adjustment portion 56 and the manual open/close valve 57 are disposed in the region in the left-right direction H in which the placement body portion 31 of the corresponding placement portion 30 is disposed. The flow rate adjustment portion 56 and the manual open/close valve 57 are disposed such that, in an equivalent arrangement region in the left-right direction H, the flow rate adjustment portion 56 is located above the placement portion 30, and the manual open/close valve 57 is further located above the flow rate adjustment portion 56 (see FIG. 4). The upstream pipe portion 53a of the branch pipe 53 is disposed, at a position further above the manual open/close valve 57, so as to extend obliquely from the vertical pipe 52 toward the back side through a gap between the strut 20 and the oblique plate portions 74 of the container 7 in the pillar-shaped space P (see FIG. 5). Note that notch-like recesses 23 that are formed by cutting off corners are provided at left and right ends of the front surface 22*a* of the second divided strut member 22 such that the oblique portion of the upstream pipe portion 53*a* can be easily provided. The upstream pipe portion 53*a* passes through a position overlapping the manual open/close valve 57 in plan view, and is connected to the manual open/close valve 57 on the side opposite to the vertical pipe 52.

The flow rate adjustment portion 56 and the manual open/close valve 57 are disposed so as to overlap each other in plan view (see FIG. 5). Then, the flow rate adjustment portion 56 and the manual open/close valve 57 that are disposed in the same arrangement region in the front-rear direction D are disposed on the back side relative to the placement body portion 31. In the present embodiment, the back end of the placement body portion 31 is at approximately the same position as a back surface 22*b* of the second divided strut member 22 constituting the strut 20, whereas the flow rate adjustment portion 56 and the manual open/close valve 57 are disposed so as to overlap the first divided strut member 21 in side view (see FIG. 6). The flow rate adjustment portion 56 and the manual open/close valve 57 are disposed on the back side relative to the back plate portion 72 of the container 7 in a state in which the container 7 is placed on the placement portion 30. Note that the flow rate adjustment portion 56 and the manual open/close valve 57 are fixed to the placement body portion 31 while being fixed to a second bracket 87. The second bracket 87 and the placement body portion 31 may be formed integrally, or may be formed separately.

The reason that such a layout configuration of the flow rate adjustment portion 56 is adopted is as follows. That is, as described above, a plurality of struts 20 are installed so as to be distributed in the left-right direction H, and a placement portion 30 is fixed to mutually adjacent struts 20 in the storage rack 2 of the present embodiment. Accordingly, a space for disposing other elements can be more easily secured on the back side relative to the placement body portion 31, than at the left and right sides of the placement body portion 31 of the placement portion 30. Therefore, in the region in the left-right direction H in which the placement body portion 31 is disposed, by disposing the flow rate adjustment portion 56 on the back side relative to the placement body portion 31, the placement portion 30 and the flow rate adjustment portion 56 can be disposed in a compact manner in each individual storage section S. Moreover, the flow rate adjustment portion 56, which has a small thickness as a whole, is used without providing a backup, normally-closed open/close valve, so that the flow rate adjustment portion 56 can be disposed so as to be fitted within the same region in the front-rear direction D in which the first divided strut member 21 is disposed (see FIG. 6). Thus, elements necessary for the purge rack can be disposed in a compact manner, without increasing the size in the front-rear direction D of the storage rack 2.

As shown in FIG. 1, the transport portion 6 for transporting the container 7 to and from the storage sections S of the storage rack 2 includes a first transport device 61, a moving device 62, a second transport device 63, and a transfer device 67. The first transport device 61 is a hoist-type guided vehicle, for example. The first transport device 61 travels along a guide rail 98 provided on a ceiling portion 97 of the site in which the storage facility 1 is installed. The first transport device 61 transports a container 7 in and out of the moving device 62 while holding the flange 76 of the container 7. The moving device 62 is a roller conveyor or belt conveyor, for example. The moving device 62 moves the container 7 between the inside and the outside of the storage room 90.

The second transport device 63 is a stacker crane, for example. The second transport device 63 includes a traveling truck 64 that travels/moves along a traveling rail 95 installed on a floor portion 91 of the storage room 90, a mast 65 provided upright on the traveling truck 64, and an elevation platform 66 that moves up and down while being guided by the mast 65. A transfer device 67 that transfers the container 7 to and from the storage section S is installed on the elevation platform 66. The transfer device 67 includes a plate-like support member 68 that supports the container 7 from below. The support member 68 is configured to be extended and retracted between a protruding position at which the support member 68 protrudes toward the inside of the storage section S, and a retracted position in which the support member 68 is retracted to the elevation platform 66 side. The second transport device 63 including the transfer device 67 performs a put-down process and a scoop process on the storage section S and the moving device 62, and performs a transfer operation to and from each of the storage section S and the moving device 62. Here, the put-down process is a process in which the container 7 is delivered to the storage section S and the moving device 62 by the transfer device 67, and the scoop process is a process in which the container 7 is scooped up and received from the storage section S and the moving device 62 by the transfer device 67.

The first transport device 61, the moving device 62, the second transport device 63, and the transfer device 67 perform a storage operation of transporting (storing) the container 7 into the storage section S, in conjunction with one another. Also, they perform a retrieval operation of transporting (retrieving) the container 7 out of the storage section S, in conjunction with one another. These operations are controlled by a control device according to an ordinary method, based on information indicating results of detection by various sensors provided in various portions of the storage facility 1.

Figure 7:
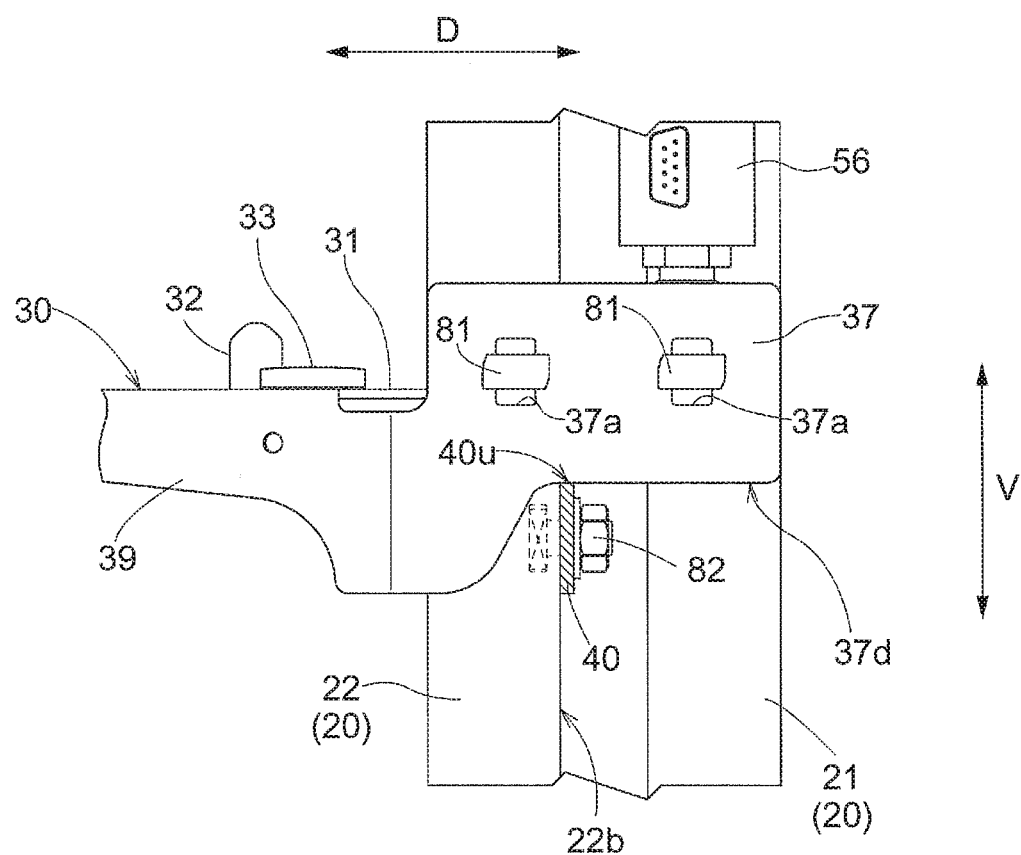
FIG. 7 is a side view of relevant portions of a storage section according to another embodiment.

Other Embodiments (1) The above embodiment was described, taking, as an example, a configuration in which the crossbar member 40 is fixed to the front surface 21*a* of the first divided strut member 21. However, the present invention is not limited to such a configuration. For example, as shown in FIG. 7, the crossbar member 40 may be fixed to the back surface 22*b* of the second divided strut member 22 located on the front side, of the pair of divided strut members 21 and 22. Such a configuration also enable the crossbar member 40 to function as a positioning member, a rotation restriction member, and a support aid member, thus achieving the same effect as that of the above embodiment. Alternatively, the crossbar member 40 may be fixed to the front surface 22*a* of the second divided strut member 22, or such a crossbar member 40 need not to be provided, depending on the case.

(2) The above embodiment was described, taking, as an example, a configuration in which the crossbar member 40 is fixed across half of the number of the first divided strut members 21 mutually adjacent in the left-right direction H. However, the present invention is not limited to such a configuration, and the number of the first divided strut members 21 across which one crossbar member 40 is installed can be set to any number. In this case, for example, the crossbar member 40 may be individually fixed only across two second divided strut members 22 mutually adjacent in the left-right direction H.

(3) The above embodiment was described, taking, as an example, a configuration in which the placement portion 30 is fixed to the pair of struts 20 in a state in which the lower end 37*d* of the mounting plate portion 37 is in contact with the upper end 40*u* of the crossbar member 40. However, the present invention is not limited to such a configuration. For example, the placement portion 30 may be fixed in a state in which the lower surface of the back end of the placement body portion 31 is in contact with the upper end 40*u* of the crossbar member 40.

(4) The above embodiment was described, taking, as an example, a configuration in which the placement body portion 31 and the rib portions 39 constituting the placement portion 30 are integrally formed. However, the present invention is not limited to such a configuration. For example, rib portions 39 formed separately from the placement body portion 31 may be fixed to the placement body portion 31.

(5) The above embodiment was described, taking, as an example, a configuration in which each strut 20 is composed of a pair of divided strut members 21 and 22 that are formed by dividing the strut 20 in two in the front-rear direction D. However, the present invention is not limited to such a configuration. For example, the strut 20 may be composed of three or more divided strut members that are formed by dividing the strut 20 in three or more in the front-rear direction D. Alternatively, the strut 20 may be configured as a unitary structure without being divided in the front-rear direction D.

(6) The above embodiment was described, taking, as an example, a configuration in which the container 7 is formed in a chamfered rectangular solid-like shape, and the vertical pipe 52 is disposed in the pillar-shaped space P between the strut 20 and the opposing oblique plate portions 74 of the mutually adjacent containers 7. However, the present invention is not limited to such a configuration, and the three-dimensional shape of the container 7 may be set to any shape. Depending on the three-dimensional shape of the container 7, the vertical pipe 52 may be disposed at a position at which the interference with the container 7 stored in the storage section S can be avoided.

Figure 8:
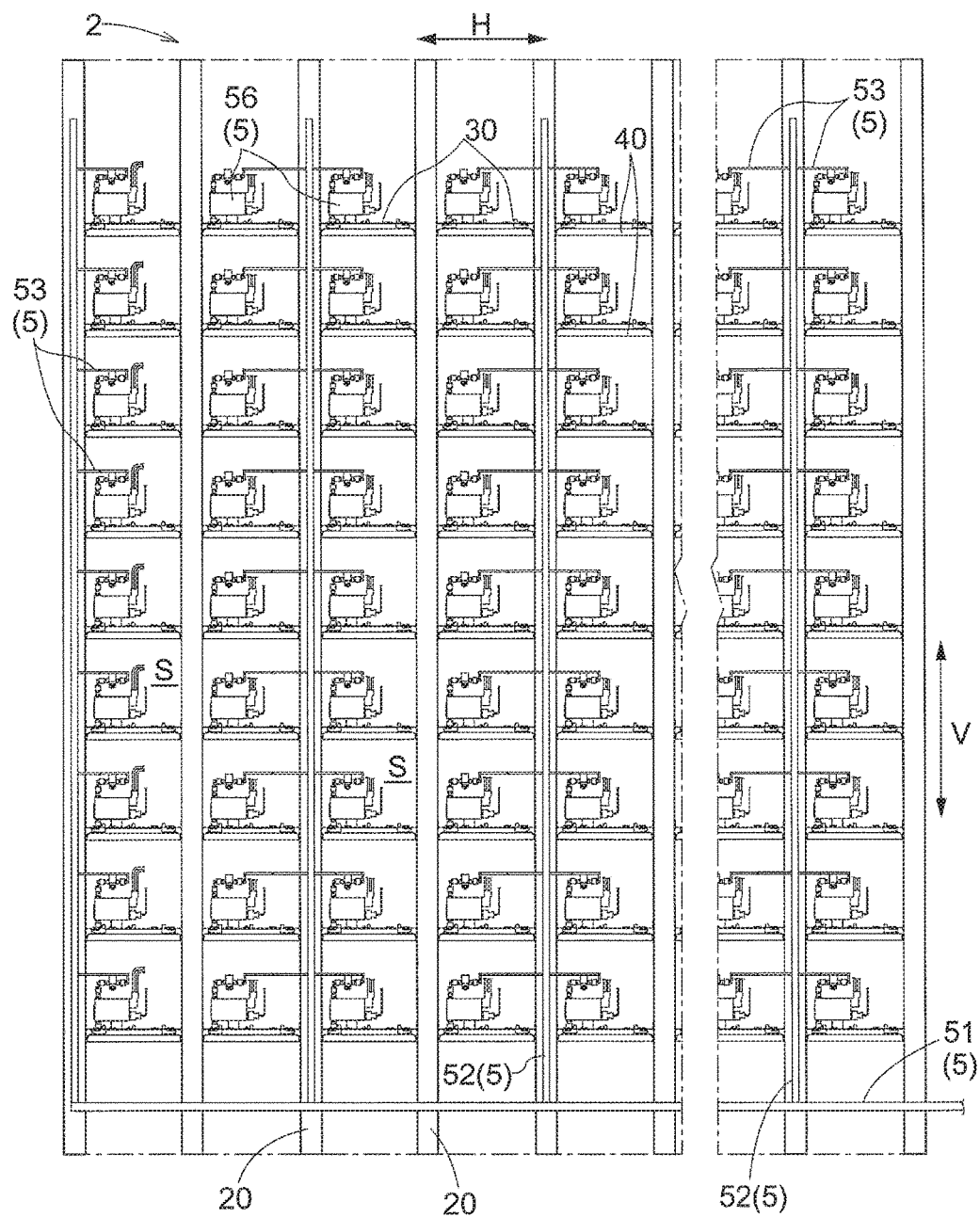
FIG. 8 is a front view of a storage rack according to another embodiment.

(7) The above embodiment was described, taking, as an example, a configuration in which the vertical pipe 52 is fixed individually to each of the plurality of struts 20 (excluding one of the two struts at the left and right ends). However, the present invention is not limited to such a configuration, and each of the plurality of vertical pipes 52 may be fixed, at least, to one of the struts 20 to which the placement portion 30 to which the inactive gas is supplied by the vertical pipe 52 is fixed. For example, as shown in FIG. 8, the vertical pipe 52 may be fixed to every other of the plurality of struts 20 aligned in the left-right direction H. In this case, a maximum of 2m branch pipes 53 equal to twice the number of rows of the storage sections S are connected to each of the vertical pipes 52. In this case, the direction in which each of the branch pipes 53 extends from the corresponding vertical pipe 52 is opposite between mutually adjacent columns. Such a configuration provides an advantage that the gas supply portion 5 can be simplified by reducing the number of the vertical pipes 52 when the number of rows of storage sections S may be relatively small.

(8) The above embodiment was described, taking, as an example, a configuration in which the vertical pipe 52 is fixed to the front surface 22*a* of the second divided strut member 22, and is disposed so as to overlap the second divided strut member 22 in front view. However, the present invention is not limited to such a configuration. For example, the vertical pipe 52 may be fixed to the side surface 21*c* of the first divided strut member 21 or the side surface 22*c* of the second divided strut member 22. In this case, the vertical pipe 52 may be disposed so as to overlap the first divided strut member 21 or the second divided strut member 22 in side view.

(9) The above embodiment was described, taking, as an example, a configuration in which a flow rate adjustment portion having a gas leakage amount of less than 0.01% in a non-energized state is used as the flow rate adjustment portion 56. However, the present invention is not limited to such a configuration. For example, the leakage amount of the inactive gas from the flow rate adjustment portion 56 in a non-energized state may be 0.01% or more.

(10) The above embodiment was described, taking, as an example, a configuration in which the flow rate adjustment portion 56 is used without providing a backup, normally-closed open/close valve. However, the present invention is not limited to such a configuration. In addition to the flow rate adjustment portion 56, a backup, normally-closed open/close valve constituted by an air valve, a solenoid valve, or the like may be provided to the branch pipe 53, for example.

(11) The above embodiment was described, taking, as an example, a configuration in which the flow rate adjustment portion 56 is disposed on the back side relative to the placement body portion 31 in the region in the left-right direction H in which the placement body portion 31 of the corresponding placement portion 30 is disposed. However, the present invention is not limited to such a configuration. For example, when a strut 20 and the placement body portion 31 are provided so as to be spaced apart from each other in the left-right direction H, the flow rate adjustment portion 56 may be disposed by using at least a portion of the region between the strut 20 and the placement body portion 31. Alternatively, the flow rate adjustment portion 56 may be disposed so as to at least partially overlap the placement body portion 31 in plan view in a region of the placement body portion 31 on the back side.

(12) The above embodiment was described, taking, as an example, a configuration in which the vertical pipes 52 are individually fixed to the plurality of struts 20 disposed so as to be distributed in the left-right direction H, and the flow rate adjustment portion 56 is disposed on the back side relative to the placement body portion 31. However, the present invention is not limited to such a configuration, and a storage facility 1 in which the vertical pipes 52 are not individually fixed to the plurality of struts 20 is also encompassed by the disclosure herein as long as at least the flow rate adjustment portion 56 is disposed on the back side relative to the placement body portion 31. More specifically, the storage facility 1 includes the following configuration. That is, the storage facility 1 includes a storage rack 2 including a plurality of storage sections S that are disposed so as to be aligned vertically, and a gas supply portion 5 that supplies an inactive gas to each of the containers 7 stored in the storage sections S. The storage rack 2 includes a plurality of struts 20 provided upright along the up-down direction V, and placement portions 30 that are supported by the struts 20 and on each of which a container 7 is placed. The gas supply portion 5 includes a flow rate adjustment portion 56 that is provided individually to the plurality of storage sections S and that adjusts the flow rate of the inactive gas. The struts 20 are installed at positions located at left and right ends of the storage rack 2 and between mutually adjacent storage sections S, and each placement portion 30 is fixed to mutually adjacent struts 20. Each of the flow rate adjustment portions 56 is disposed on the back side relative to the placement body portion 31 of the placement portion 30 constituting the corresponding storage section S in the region in the left-right direction H in which that placement body portion 31 is disposed.

With this configuration, each placement portion 30 is fixed to mutually adjacent struts 20, so that the space for disposing other elements can be more easily secured on the back side relative to the placement body portion 31 than on left and right sides of the placement body portion 31 of the placement portion 30. Therefore, by disposing the flow rate adjustment portion 56 on the back side relative to the placement body portion 31 in the region in the left-right direction H in which the placement body portion 31 is disposed as described above, the placement portion 30 and the flow rate adjustment portion 56 can be disposed in a more compact manner in each individual storage section S. Thus, the plurality of storage sections S can be disposed so as to be aligned highly densely, making it possible to improve the storage efficiency of the storage rack 2. Furthermore, since the flow rate adjustment portions 56 are provided individually to the plurality of storage sections S, the inactive gas can be supplied in the desired supply pattern to each individual container 7 stored in the storage section S. Thus, even when the containers 7 are stored in the storage rack 2 at different times, it is easy to properly maintain the state of the articles contained in the containers 7.

(13) The above embodiment was described, taking, as an example, the storage facility 1 for storing containers 7 accommodating semiconductor substrates as storage articles. However, the present invention is not limited to such a configuration. For example, the articles that are accommodated and stored in the container 7 may be glass substrates, reticle substrates each constituted by a glass plate on which a metal thin film is stacked, or the like. The articles that are accommodated and stored in the container 7 are not limited to industrial products (including a raw material and an intermediate product), and may be, for example, food products, medical and pharmaceutical products, or the like.

Note that the configurations disclosed in the embodiments described above (including Embodiment and Other Embodiments described above; the same also applies to the following) are applicable in combination with configurations disclosed in other embodiments as long as no inconsistency arises.

With regard to the other configurations as well, the embodiments disclosed herein are in all respects as illustrative, and the scope of the present invention is not to be limited by the embodiments. It will be apparent for a person skilled in the art that various modifications may be made without departing from the gist of the present invention. Therefore, alternative embodiments achieved by modifying the embodiments described above without departing from the gist of the present invention are, of course, also included within the scope of the present invention.

Outline of the Embodiment

The following describes an outline of the article transport facility described above.

A storage facility includes:

a storage rack including a plurality of storage sections that are disposed so as to be aligned in a plurality of rows in an up-down direction and a plurality of columns in a left-right direction; and a gas supply portion that supplies an inactive gas to each container stored in the storage sections, wherein the storage rack includes a plurality of struts provided upright along the up-down direction, and placement portions that are supported by the struts and on which the containers are placed, the gas supply portion includes a plurality of vertical pipes extending in the up-down direction, and a plurality of branch pipes that branch off from each of the vertical pipes and are connected to gas inlets provided individually on the placement portions, the struts are installed at positions located at left and right ends of the storage rack and between mutually adjacent ones of the storage sections, each of the placement portions is fixed to mutually adjacent ones of the struts, and each of the plurality of vertical pipes is fixed to one of the struts to which the placement portion to which the inactive gas is supplied by the vertical pipe is fixed.

With this configuration, the struts are installed so as to be distributed at positions located at left and right ends of the storage rack and between mutually adjacent storage sections, so that each individual placement portion can be fixed to mutually adjacent struts. This allows the plurality of storage sections to be handled independently for each column, without grouping the storage sections into units spanning the plurality of columns. Then, by disposing the plurality of vertical pipes constituting the gas supply portion so as to be distributed according to the arrangement of the plurality of struts, it is possible to reduce the diameter of each individual vertical pipe. Accordingly, the plurality of vertical pipes for supplying the inactive gas to the gas inlets provided individually on the placement portions can be provided in the peripheral region of each of the plurality of struts disposed so as to be distributed, while avoiding the interference with other elements. Thus, it is not necessary to secure the space for providing the vertical pipes by compromising the installation space for the placement portions, so that it is possible to utilize all of the columns as the storage sections. Therefore, it is possible to improve the storage efficiency in a storage facility configured to purge each of the storage containers with the inactive gas.

Here, it is preferable that each of the plurality of vertical pipes is disposed on a front side relative to corresponding one of the struts so as to overlap the strut in front view.

With this configuration, it is possible to substantially ensure that the interference between the vertical pipe and the other elements such as the placement portion that are included in the storage facility is avoided. In the case of performing the operation of installing a gas supply portion in a worksite, the operator can easily provide and fix the vertical pipe to the front surface of the strut while facing the storage rack. Thus, the vertical pipe can be provided easily and appropriately.

Here, it is preferable that each of the plurality of vertical pipes is disposed in one-to-one correspondence with one of the plurality of struts, and a number of the branch pipes that corresponds to a number of rows of the storage sections are connected to each of the vertical pipes.

With this configuration, the vertical pipes are individually fixed to the struts (excluding one of the two struts on the left and right sides). Accordingly, the diameter of each individual vertical pipe can be further reduced, thus increasing the degree of freedom in disposing the vertical pipe in the peripheral region of the strut. Alternatively, it is possible to secure a relatively large amount of inactive gas that can flow through a vertical pipe by maintaining the diameter of the vertical pipe at a relatively large diameter within a range that can avoid the interference with other elements, thus making it possible to increase the number of rows of the storage sections (improve the storage capacity).

Here, it is preferable that the gas supply portion further includes a flow rate adjustment portion that is provided on the branch pipes and adjusts a flow rate of the inactive gas, and the flow rate adjustment portion is disposed on a back side relative to a placement body portion of the corresponding placement portion in a region in the left-right direction in which the placement body portion is disposed.

With this configuration, the flow rate adjustment portion is provided individually to each of the plurality of storage sections. Accordingly, the inactive gas can be supplied in the desired supply pattern to each individual storage container. Thus, even when the containers are stored in the storage rack at different times, it is easy to properly maintain the state of the articles contained in the containers. According to the present invention, each placement portion is fixed to mutually adjacent struts, so that the space for disposing other elements can be more easily secured on the back side relative to the placement body portion than at the left and right sides of the placement body portion of the placement portion. Therefore, by disposing a flow rate adjustment portion on the back side relative to the placement body portion in the region in the left-right direction in which the placement body portion is disposed as described above, the placement portion and the flow rate adjustment portion can be disposed in a compact manner in each individual storage section.

Here, it is preferable that a flow rate adjustment portion having a gas leakage amount of less than 0.01% in a non-energized state is used as the flow rate adjustment portion, without providing a backup, normally-closed open/close valve.

With this configuration, the highly airtight flow rate adjustment portion is used, so that there will be substantially no leakage of the inactive gas from the flow rate adjustment portion even if a system including the storage facility is emergently stopped due to an unexpected error or the like. Accordingly, it is not necessary to provide a backup, normally-closed open/close valve to the flow rate adjustment portion to prepare for such an unexpected situation. Thus, it is possible to simplify the layout in the vicinity of the flow rate adjustment portion, and dispose the placement portion and the flow rate adjustment portion in an even more compact manner.

Here, it is preferable that each of the containers is formed in a chamfered rectangular solid-like shape having a back plate portion, a pair of side plate portions, and planar or curved oblique plate portions in regions between the back plate portion and each of the pair of side plate portions, and each of the vertical pipes is disposed in a pillar-shaped space defined by opposing one of the oblique plate portions of the containers that are mutually adjacent in a state in which the containers are placed on the placement portions, and the strut to which the placement portions on which the mutually adjacent containers are respectively placed are fixed in common.

With this configuration, by using the space defined by the opposing oblique plate portions of a pair of mutually adjacent containers having a chamfered rectangular solid-like shape, it is possible to dispose the plurality of struts so as to be appropriately distributed in the left-right direction while avoiding the interference with the storage containers. By using the pillar-shaped space defined by the opposing oblique plate portions of the pair of mutually adjacent containers and the strut disposed therebetween, it is possible to appropriately fix each of the vertical pipes to the corresponding strut while avoiding the interference with the storage container.

Here, it is preferable that each of the placement portions is fixed, on a back side thereof, to the struts in a cantilevered manner, and each of the struts includes a pair of divided strut members that are formed by dividing the strut in the front-rear direction.

With this configuration, the placement portion is fixed on the back side in a cantilevered manner and is open on the front side, so that the container can be easily transferred to and from the storage section from the front. Since the strut includes a pair of divided strut members that are formed by dividing the strut in the front-rear direction, it is possible to reduce the material cost, while maintaining the same level of strength as that of a strut configured as a unitary structure.

Here, it is preferable that the storage rack further includes a crossbar member that extends in the left-right direction and is fixed to a front surface of a first divided strut member located on a back side or a back surface of a second divided strut member located on a front side, of the pair of divided strut members, and each of the placement portions is fixed to the struts in a state in which at least a portion of the placement portion is in contact with an upper end of the crossbar member.

With this configuration, the positioning of the placement portion in the up-down direction can be accurately performed by bringing a portion of the placement portion into contact with the upper end of the crossbar member. Moreover, such a crossbar member for positioning is provided between the pair of divided strut members in the front-rear direction. Accordingly, even when a vertical pipe is disposed in front of the strut, the crossbar member or the fixing member for fixing the crossbar member to the strut will not interfere with the vertical pipe. The container can be inserted more deeply into the storage section regardless of the size of the crossbar member than when the crossbar member is fixed to the front surface of the second divided strut member, for example. Accordingly, it is possible to improve the storage efficiency in the front-rear direction. Furthermore, when the placement portion is fixed at least to the first divided strut member, a portion of the load acting on the placement portion can also be received by the crossbar member in a state in which the container is placed on the placement portion. Thus, it is possible to increase the supporting strength of the placement portion to the container.

Here, it is preferable that each of the placement portions includes a placement body portion having a U-shape in plan view, and rib portions provided integrally with the placement body portion, the rib portions extending linearly so as to connect U-shape distal end portions that serve as load bearing points of the placement body portion to the struts.

With this configuration, the container can be easily transferred by using a cut-out portion of the placement body portion having a U-shape in plan view. Since the placement portion is provided with the rib portions integrated with the placement body portion, it is possible to increase the strength of the placement portion itself. In this case, the rib portions extend linearly so as to connect the U-shape distal end portions serving as the load bearing points of the placement body portion to the struts, so that it is possible to ensure a sufficient supporting strength of the placement portion to the container without additionally providing an reinforcing member at the connecting portion between the strut and the placement portion.

The invention claimed is:

1. A storage facility comprising:
a storage rack including a plurality of storage sections that are disposed so as to be aligned in a plurality of rows in an up-down direction and a plurality of columns in a left-right direction; and
a gas supply portion that supplies an inactive gas to each container stored in the storage sections, wherein:
the storage rack includes a plurality of struts provided upright along the up-down direction, and placement portions that are supported by the struts and on which the containers are placed,
the gas supply portion includes a plurality of vertical pipes extending in the up-down direction, and a plurality of branch pipes that branch off from each of the vertical pipes and are connected to gas inlets provided individually on the placement portions,
the struts are installed at positions located at left and right ends of the storage rack and between mutually adjacent ones of the storage sections,
each of the placement portions is fixed to mutually adjacent ones of the struts,
each of the plurality of vertical pipes is fixed to one of the struts to which the placement portion to which the inactive gas is supplied by the vertical pipe is fixed,
the gas supply portion further includes a flow rate adjustment portion that is provided on the branch pipes and adjusts a flow rate of the inactive gas, and
the flow rate adjustment portion has a gas leakage amount of less than 0.01% in a non-energized state, without providing a backup, normally closed open/close valve.

2. The storage facility according to claim 1, wherein each of the plurality of vertical pipes is disposed on a front side relative to a corresponding one of the struts so as to overlap the strut in front view.

3. The storage facility according to claim 1, wherein each of the plurality of vertical pipes is disposed in one-to-one correspondence with one of the plurality of struts, and
a number of the branch pipes that corresponds to a number of rows of the storage sections are connected to each of the vertical pipes.

4. The storage facility according to claim 1, wherein the flow rate adjustment portion is disposed on a back side relative to a placement body portion of the corresponding placement portion in a region in the left-right direction in which the placement body portion is disposed.

5. The storage facility according to claim 1, wherein each of the containers is formed in a chamfered rectangular solid-like shape having a back plate portion, a pair of side plate portions, and planar or curved oblique plate portions in regions between the back plate portion and each of the pair of side plate portions, and
each of the vertical pipes is disposed in a pillar-shaped space defined by opposing one of the oblique plate portions of the containers that are mutually adjacent in a state in which the containers are placed on the placement portions, and the strut to which the placement portions on which the mutually adjacent containers are respectively placed are fixed in common.

6. The storage facility according to claim 1, wherein each of the placement portions is fixed, on a back side thereof, to the struts in a cantilevered manner, and
each of the struts includes a pair of divided strut members that are formed by dividing the strut in the front-rear direction.

7. The storage facility according to claim 6, wherein the storage rack further includes a crossbar member that extends in the left-right direction and is fixed to a front surface of a first divided strut member located on a back side or a back surface of a second divided strut member located on a front side, of the pair of divided strut members, and
each of the placement portions is fixed to the struts in a state in which at least a portion of the placement portion is in contact with an upper end of the crossbar member.

8. The storage facility according to claim 1, wherein each of the placement portions includes a placement body portion having a U-shape in plan view, and rib portions provided integrally with the placement body portion, the rib portions extending linearly so as to connect the struts to U-shape distal end portions that serve as load bearing points of the placement body portion.

9. A storage facility comprising:
a storage rack including a plurality of storage sections that are disposed so as to be aligned in a plurality of rows in an up-down direction and a plurality of columns in a left-right direction; and
a gas supply portion that supplies an inactive gas to each container stored in the storage sections, wherein:
the storage rack includes a plurality of struts provided upright along the up-down direction, and placement portions that are supported by the struts and on which the containers are placed,
the gas supply portion includes a plurality of vertical pipes extending in the up-down direction, and a plurality of branch pipes that branch off from each of the vertical pipes and are connected to gas inlets provided individually on the placement portions,
the struts are installed at positions located at left and right ends of the storage rack and between mutually adjacent ones of the storage sections,
each of the placement portions is fixed to mutually adjacent ones of the struts,
each of the placement portions is fixed, on a back side thereof, to the struts in a cantilevered manner,
each of the struts includes a pair of divided strut members that are formed by dividing the strut in the front-rear direction,
the storage rack further includes a crossbar member that extends in the left-right direction and is fixed to a front surface of a first divided strut member located on a back side or a back surface of a second divided strut member located on a front side, of the pair of divided strut members, and
each of the placement portions is fixed to the struts in a state in which at least a portion of the placement portion is in contact with an upper end of the crossbar member.

* * * * *